United States Patent [19]
Fu et al.

[11] Patent Number: 5,475,637
[45] Date of Patent: Dec. 12, 1995

[54] ACTIVE BIT-LINE CLAMP CIRCUIT FOR FLAT CELL STRUCTURE OF MASK READ-ONLY MEMORY

[75] Inventors: Stephen Fu, Chung-li; Te-Sun Wu, Hsinchu Hsien, both of Taiwan

[73] Assignee: United Microelectronics Corp., Hsinchu, Taiwan

[21] Appl. No.: 365,602

[22] Filed: Dec. 27, 1994

[51] Int. Cl.$^6$ ............................................. G11C 7/00
[52] U.S. Cl. ................................. 365/189.06; 365/189.11
[58] Field of Search ........................... 365/189.06, 189.11

[56] References Cited

U.S. PATENT DOCUMENTS

| | | | |
|---|---|---|---|
| 4,899,311 | 2/1990 | Petschauer et al. | 365/189.06 |
| 5,132,936 | 7/1992 | Keswick et al. | 365/189.06 |
| 5,307,307 | 4/1994 | Wada et al. | 365/189.06 X |
| 5,369,613 | 11/1994 | Matsui | 365/189.06 |

*Primary Examiner*—David C. Nelms
*Assistant Examiner*—Son Dinh
*Attorney, Agent, or Firm*—Ladas & Parry

[57] ABSTRACT

A mask ROM device having active bit-line clamp circuits which employ a voltage-to-current converter as the clamp circuit for selectively coupling a main bit line of the ROM memory device to a selected one of virtual ground lines. The voltage-to-current converter is selectively coupled between the main bit line and a first or second virtual ground line for clamping therebetween. The voltage-to-current converter converts the voltage difference between the coupled main bit line and the selected first or second virtual ground line into a corresponding current in proportion to a voltage difference, the converted current being coupled to the selected first or second virtual ground line.

6 Claims, 3 Drawing Sheets

5,475,637

ACTIVE BIT-LINE CLAMP CIRCUIT FOR FLAT CELL STRUCTURE OF MASK READ-ONLY MEMORY

BACKGROUND OF THE INVENTION

1. Field of the Invention

The present invention relates in general to a mask read-only memory (ROM) device having active bit-line clamp circuits. In particular, the present invention relates to a mask ROM device having active bit-line clamp circuits capable of correct and fast accessing of the data bit stored in the memory cells.

2. Technical Background

Mask ROM devices are widely used in digital electronic equipment. For example, in microprocessor-based computer systems, applications such as the storage for digital dictionary databases, as well as program code for TV games require large ROM storage spaces. Mask ROM devices are being asked to have ever increasing storage capacity, while featuring shorter turn-around time.

FIG. 1 shows the schematic diagram of a conventional mask ROM device having clamp circuits. In the mask ROM device of FIG. 1, a number of memory cells $M_1$, $M_2$, $M_3$, $M_4$, ... are shown to form a memory cell array. A number of word lines $WL_i$, that is, $WL_0$, ..., $WL_5$, are utilized for accessing the memory cells in the mask ROM device. The mask ROM device is configured as even and odd columns, as indicated in the drawing by reference numerals OC and EC respectively, and with the $SE_i$ and $SO_i$ utilized as the even and odd select lines respectively, while CS is the column select line. BL indicates representative bit lines. MBL is a main bit line for the mask ROM device. $GL_1$ and $GL_2$ are first and second virtual ground lines respectively. $GS_1$ and $GS_2$ are logically complementary first and second virtual ground select lines. Bit-line parasitic capacitors are represented by $C_0$, $C_1$, $C_2$, ... respectively. Sense amplifier 10 is coupled to node B of NMOS FET $N_{21}$. Clamp circuit 20 is coupled to node C of NMOS FET $N_{24}$ and node D of NMOS FET $N_{25}$.

In the mask ROM device, when the even column select line $Se_i$, the first virtual ground select line $GS_1$, and the word line $WL_0$ are active, and when the first virtual ground line $GL_1$, under control of the NMOS FET $N_{20}$ strobed by the column select line CS, is coupled to the drain of the NMOS FET $N_{23}$ strobed by the first virtual ground select line $GS_1$, the memory cell $M_1$ is then in the state of being accessed. During this stage, if the memory cells $M_2$ and $M_3$ are in the "ON" state, their bit-line parasitic capacitances $C_2$ and $C_3$ will place extra loading on sense amplifier 10 because of the effect of electric charge distribution.

In order to avoid the added loading of parasitic capacitors $C_2$ and $C_3$ as described above, the conventional mask ROM device of FIG. 1 has its second virtual ground line $GL_2$, under control of the NMOS FET $N_{22}$ also strobed by the column select line CS, coupled to the drain of the NMOS FET $N_{24}$ strobed by second virtual ground select line $GS_1$. The source of NMOS FET $N_{24}$ is connected at node C to clamp circuit 20.

This arrangement allows for the charging of bit-line parasitic capacitors $C_2$ and $C_3$ while memory cell $M_1$ of the mask ROM device is being accessed, thereby reducing the effect of capacitive loading on sense amplifier 10 placed by parasitic capacitors $C_2$ and $C_3$. In the mask ROM device of FIG. 1, the logic circuitry of sense amplifier 10 is shown in FIG. 2A. Clamp circuit 20 has logic circuitry similar to that of sense amplifier 10 and is shown in FIG. 2B. Their only difference is the trip voltage of the respective NOR gate 100.

One problem of clamp circuit 20 is apparent. That is, if the trip voltage of it's NOR gate 100 is set high, the charging voltage will also be high. This reduces the sensing speed of sense amplifier 10 when memory cell $M_1$ is in its ON state. On the other hand, if the trip voltage of it's NOR gate 100 is set low, the charging voltage will therefore be low. This reduces the sensing speed of sense amplifier 10 when memory cell $M_1$ is in its OFF state. This phenomena adds to the designing complexity of sense amplifier 10 and clamp circuit 20 of the mask ROM device, as the optimization becomes difficult to set.

SUMMARY OF THE INVENTION

It is therefore an object of the present invention to provide a mask ROM device having active bit-line clamp circuits capable of correct and fast accessing of the data bit stored in the memory cells.

The present invention achieves the above indicated objects by providing a mask ROM semiconductor device having active bit-line clamp circuits wherein the mask ROM device includes a plurality of memory cells arranged in at least one array, a number of word lines each coupled to the memory cells for strobing the memory cells, at least one first virtual ground line coupled to the memory cells for strobing the memory cells, at least one second virtual ground line coupled to the memory cells for strobing the memory cells, at least one main bit line coupled to the memory cells for strobing the memory cells and at least one sense amplifier coupled to one of the main bit lines for sensing to access the content of the memory cells. At least one voltage-to-current converter is selectively coupled between the main bit lines and one of the first and second virtual ground lines for clamping therebetween. The voltage-to-current converter converts the voltage difference between the coupled main bit line and the selected virtual ground line into a corresponding current in proportion to the voltage difference, the converted current being coupled to the selected virtual ground line.

BRIEF DESCRIPTION OF THE DRAWING

Other objects, features and advantages of the present invention will become apparent by way of the following detailed description of the preferred but non-limiting embodiment. The description is made with reference to the accompanied drawings, wherein.

DETAILED DESCRIPTION OF THE PREFERRED EMBODIMENT

Figure 1:
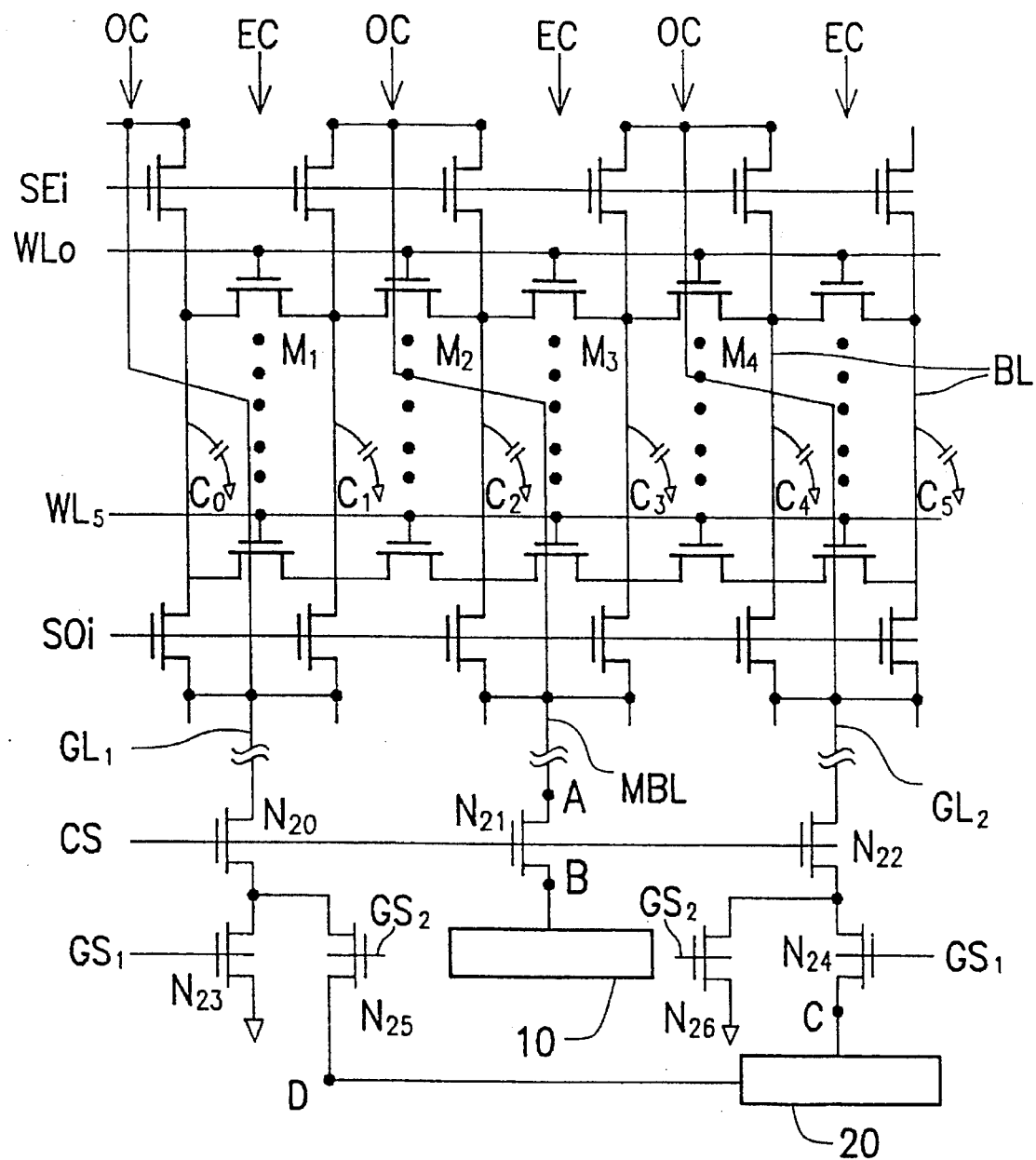
FIG. 1 shows the schematic diagram of a conventional mask ROM device having clamp circuits.
Figure 2A:
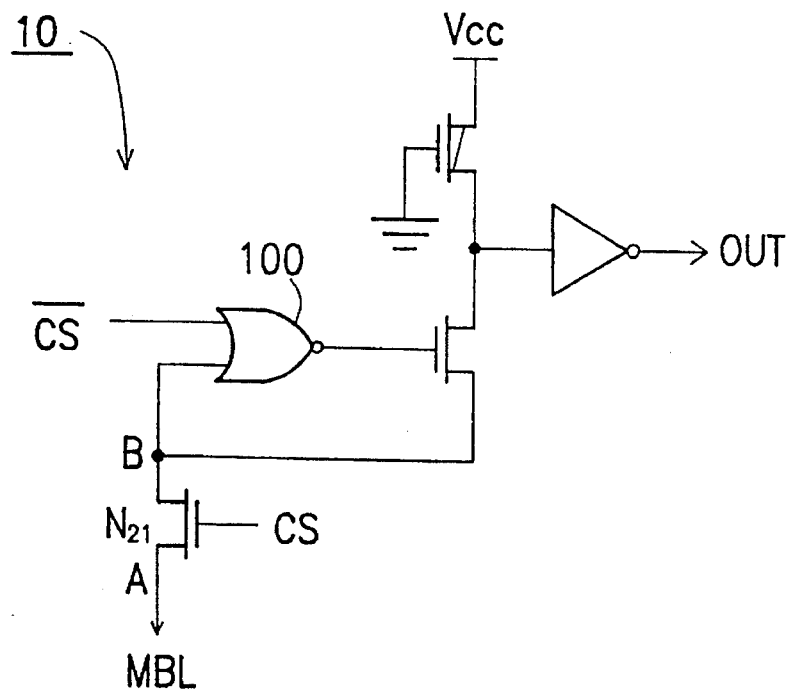
FIG. 2A shows the sense amplifier employed in the mask ROM device of FIG. 1.
Figure 2B:
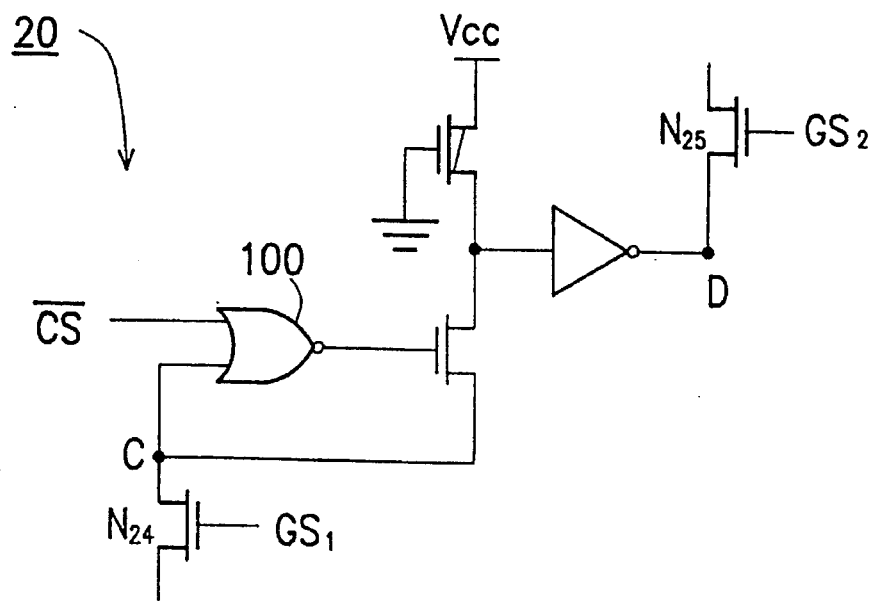
FIG. 2B shows the clamp circuit employed in the mask ROM device of FIG. 1.
Figure 3:
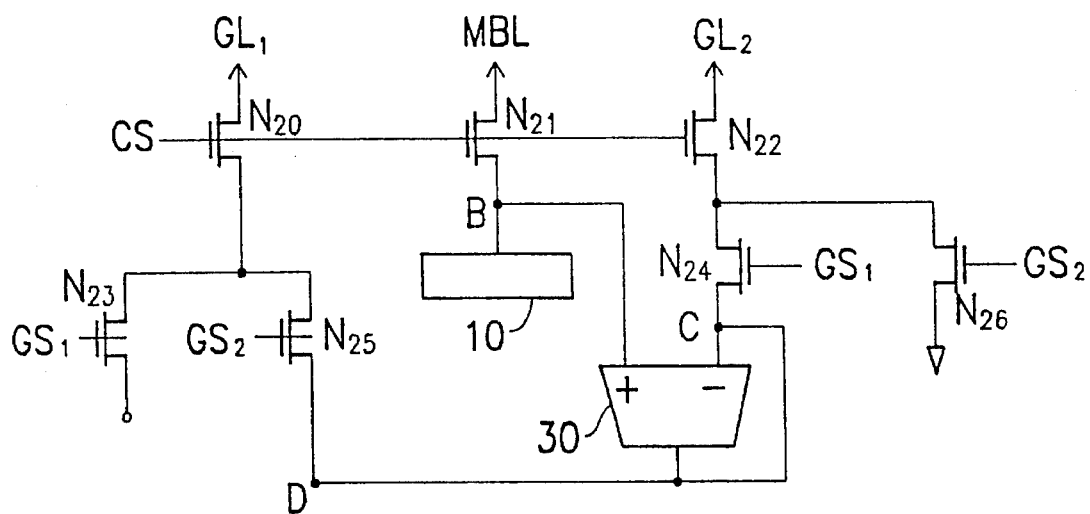
FIG. 3 shows the schematic diagram of a mask ROM device having active bit-line clamp circuits that employs a voltage-to-current converter in accordance with a preferred embodiment of the present invention.

Referring to FIG. 3., the schematic diagram of a mask ROM device having active bit-line clamp circuits that employ a voltage-to-current converter in accordance with a preferred embodiment of the present invention is shown. Although the memory cells are not shown in the figure, it can be observed that voltage-to-current converter 30 is utilized as the clamp circuit for the mask ROM device as compared to the conventional device depicted in FIG. 1 and FIG. 2B.

When the mask ROM device is accessed, column select line CS, as well as first virtual ground select line $GS_1$, is activated, and voltage-to-current converter 30 will be coupled to both main bit line MBL and second virtual ground line $GL_2$, serving the function of a clamp circuit for the mask ROM device. Voltage-to-current converter 30 serves to convert the voltage at its input into corresponding current amount at its output. Therefore, the electrical potential difference between the voltages at main bit line MBL and at second virtual ground line $GL_2$ is converted into a proportional current by voltage-to-current converter 30 and is coupled back to second virtual ground line $GL_2$ through node C.

When, on the other hand, the access to the mask ROM device is changed and second virtual ground select line $GS_2$ instead of $GS_1$ is activated, the operation of the mask ROM device employing voltage-to-current converter 30 is similar to that described above. When second virtual ground select line $GS_2$ is activated as the content of memory cell $M_3$ is accessed, voltage-to-current converter 30 is coupled between main bit line MBL and first virtual ground line $GL_1$ through node D instead of second virtual ground line $GL_2$ as described above, second virtual ground line $GL_2$ being grounded.

Figure 4:
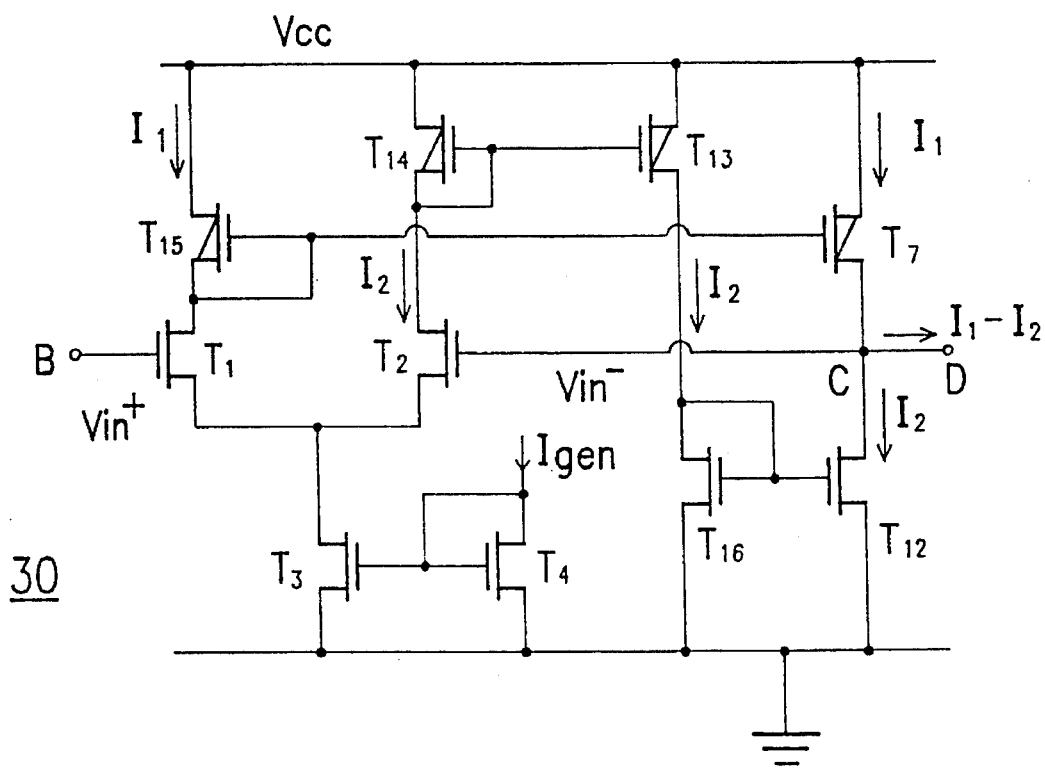
FIG. 4 shows the schematic diagram of an embodiment of the voltage-to-current converter employed in FIG. 3.

FIG. 4 shows the schematic diagram of an embodiment of the voltage-to-current converter employed in FIG. 3. In the exemplified embodiment, voltage-to-current converter 30 takes the form of an operational transconductance amplifier (OTA). An OTA is characterized by its very high unity gain frequency $f_u$ that is particularly suitable for high speed operation required for the short turn-around time.

As is observed in FIG. 4, $T_7$, $T_{13}$, $T_{14}$ and $T_{15}$ are PMOS FET's having identical dimensional width and length in their fabrication. All the other transistors are NMOS FET's, with $T_1$, $T_2$, $T_{12}$ and $T_{16}$ having identical dimensional width and length in their fabrication. The OTA serving as the voltage-to-current converter has an input node B for receiving the voltage input $Vin^+$ and an output node C, which is also coupled to node D, for its converted current signal $I_1 - I_2$.

Assuming the voltage at node B is Vin+, which is the voltage of main bit line MBL, and the voltage at node C and node D is $Vin^-$, which is the voltage of second virtual ground line $GL_2$, the characteristic of the OTA ensures that the output current at node C and node D, that is, $I_1 - I_2$, is the larger when the difference between voltages $Vin^+$ and $Vin^-$ is the larger. On the other hand, when the voltage difference of $Vin^+$ and $Vin^-$ is the smaller, the output current at node C and node D, $I_1 - I_2$, is the smaller. When the voltage difference is sufficiently small, output current $I_1 - I_2$ would approach zero, making the OTA of FIG. 3 substantially cease operation. This avoids the problem of optimization of the prior art clamp circuit as described above.

Thus, with the voltage-to-current converter OTA serving as the clamp circuit for the mask ROM device, the characteristics of high unity gain frequency of the OTA ensures the high speed operation of the mask ROM device. The voltage-to-current converter serves to couple the main bit line of the mask ROM device to the first or second virtual ground line in accordance with the state of the first and second virtual ground select lines, and functions as the clamp circuit for the mask ROM device. The functionally proportional relationship between the input voltage difference (between the main bit line and the selected virtual ground line) and the output current (coupled to the selected virtual ground line) ensures that the clamping will be rapid and the access to the memory content of the selected memory cell accurate.

The above-described preferred embodiment of the present invention is utilized only for the purpose of the description of the present invention. Persons skilled in this art can appreciate the fact that other similar arrangements can be devised from the embodiments disclosed above without departing from the spirit of the present invention, which is recited in the claims that follow.

We claim:

1. A mask ROM device having an active bit-line clamp circuit comprising:

a plurality of memory cells arranged in at least one array;

a plurality of word lines each coupled to said memory cells for strobing said memory cells;

at least one first virtual ground line coupled to said memory cells for strobing of said memory cells;

at least one second virtual ground line coupled to said memory cells for strobing said memory cells;

at least one main bit line coupled to said memory cells for strobing said memory cells;

at least one sense amplifier coupled to one of said plurality of main bit lines for sensing to access the content of said memory cells; and at least one voltage-to-current converter being coupled between said main bit line and a selected virtual ground line selected from said first and second virtual ground lines, said voltage-to-current converter converting a voltage difference between said coupled main bit line and said selected virtual ground line into a corresponding current in proportion to said voltage difference, said corresponding current being coupled to said selected virtual ground line.

2. The mask ROM device of claim 1, wherein the voltage-to-current converter is an operational transconductance amplifier.

3. The mask ROM device of claim 2, wherein said memory cells are metal-oxide semiconductor field-effect transistors.

4. A method of circuit clamping for a mask ROM device, said mask ROM device including a plurality of memory cells arranged in at least one array, a plurality of word lines each coupled to said memory cells for strobing said memory cells, at least one first virtual ground line coupled to said memory cells for strobing of said memory cells, at least one second virtual ground line coupled to said memory cells for strobing said memory cells, at least one main bit line coupled to said memory cells for strobing said memory cells, at least one sense amplifier coupled to one of said plurality of main bit lines for sensing to access the content of said memory cells, said method of circuit clamping comprising the steps of:

coupling at least one voltage-to-current converter between said main bit line and a selected virtual ground line selected from said first and second virtual ground lines;

converting by said voltage-to-current converter a voltage difference between said coupled main bit line and said selected virtual ground line into a corresponding current in proportion to said voltage difference; and coupling said corresponding current to said selected virtual ground line.

5. The method of circuit clamping of claim 4, wherein the step of converting is performed by an operational transconductance amplifier.

6. A clamping circuit for a mask ROM device, said mask ROM device including a plurality of memory cells arranged in at least one array, a plurality of word lines each coupled to said memory cells for strobing said memory cells, at least one first virtual ground line coupled to said memory cells for strobing of said memory cells, at least one second virtual ground line coupled to said memory cells for strobing said memory cells, at least one main bit line coupled to said memory cells for strobing said memory cells, at least one sense amplifier coupled to one of said plurality of main bit lines for sensing to access the content of said memory cells, said clamping circuit comprising:

at least one voltage-to-current converter coupled between said main bit line and a selected virtual ground line selected from said first and second virtual ground lines, said voltage-to-current converter including:

(a) means for converting a voltage difference between said coupled main bit line and said selected virtual ground line into a corresponding current in proportion to said voltage difference, and (b) means for coupling said corresponding current to said selected virtual ground line.

* * * * *